US012635320B2

(12) United States Patent
Zhou et al.

(10) Patent No.: US 12,635,320 B2
(45) Date of Patent: May 19, 2026

(54) MICRO LIGHT-EMITTING DISPLAY MODULE INCLUDING SEALANT LAYERS HAVING OPTICAL PARTICLES

(71) Applicant: Guangzhou China Star Optoelectronics Semiconductor Display Technology Co., Ltd., Guangzhou (CN)

(72) Inventors: Xiaobo Zhou, Guangzhou (CN); Wei Wu, Guangzhou (CN)

(73) Assignee: GUANGZHOU CHINA STAR OPTOELECTRONICS SEMICONDUCTOR DISPLAY TECHNOLOGY CO., LTD., Guangzhou (CN)

( * ) Notice: Subject to any disclaimer, the term of this patent is extended or adjusted under 35 U.S.C. 154(b) by 400 days.

(21) Appl. No.: 18/314,863

(22) Filed: May 10, 2023

(65) Prior Publication Data

US 2024/0258473 A1 Aug. 1, 2024

(30) Foreign Application Priority Data

Jan. 31, 2023 (CN) .......................... 202310073339.3

(51) Int. Cl.
*H10H 20/854* (2025.01)
*H10H 20/855* (2025.01)
*H10W 90/00* (2026.01)

(52) U.S. Cl.
CPC ........ *H10H 20/854* (2025.01); *H10H 20/855* (2025.01); *H10W 90/00* (2026.01)

(58) Field of Classification Search
CPC ............................ H01L 25/167; H10H 29/142
USPC .............................................. 257/13, 79, 100
See application file for complete search history.

(56) References Cited

U.S. PATENT DOCUMENTS

| | | | |
|---|---|---|---|
| 2011/0006316 A1* | 1/2011 | Ing ........................ | G02B 5/0236 257/89 |
| 2020/0381586 A1* | 12/2020 | Yu .......................... | G09F 9/3026 |
| 2023/0163111 A1* | 5/2023 | Yen ........................ | H01L 25/167 257/91 |
| 2024/0145652 A1* | 5/2024 | Hussell ............... | H01L 25/0753 |

* cited by examiner

*Primary Examiner* — Ratisha Mehta
*Assistant Examiner* — Mikka Liu
(74) *Attorney, Agent, or Firm* — PV IP PC; Christopher S. Ruprecht; Wei Te Chung

(57) ABSTRACT

A micro light-emitting display module includes sequentially stacked a substrate, a light-emitting chips, an original sealant layer, and a repair sealant layer, the original sealant layer is located in a first display area and a second display area, and the repair sealant layer is located in the first display area, A mass proportion of optical particles in the repair sealant layer is different from that of optical particles in the original sealant layer, and/or, the types of the optical particles in the repair sealant layer is different from that of the optical particles in the original sealing layer. By optimizing the types and the mass proportion of the optical particles in the repair sealant layer, the color difference between the repaired first display area and the normal second display area could be made close.

20 Claims, 1 Drawing Sheet

MICRO LIGHT-EMITTING DISPLAY MODULE INCLUDING SEALANT LAYERS HAVING OPTICAL PARTICLES

CROSS-REFERENCE TO RELATED APPLICATION

This application claims priority to and the benefit of Chinese Patent Application No. 202310073339.3, filed on Jan. 31, 2023, the disclosure of which is incorporated herein by reference in its entirety.

TECHNICAL FIELD

The present disclosure relates to a field of display technology, and particularly relates to a micro light-emitting display module.

BACKGROUND

Light-emitting diode (LED) display application technology is booming, at present, there are more or less technical bottlenecks in applications of a projection, a liquid crystal display (LCD), an organic light-emitting diode (OLED) and other display technologies. As a new type of small-pitch infinite splicing high-definition display technology, micro/mini light-emitting diode (MLED) has been paid high attention, especially in indoor large-screen high-definition display scenarios, such as command centers, conference centers, security monitoring, home large-screen televisions and other application scenarios.

As a protective layer of a light-emitting device, a sealant layer needs to meet a requirement of defect-free encapsulation. In actual production, in order to balance quality and yield, there are two stages of repair requirements for the sealant layer: 1. process defects such as pinholes, foreign objects, bubbles, and lack of sealant during a sealing process; 2. defects caused by repairing dead lights after sealing, such as aged dead lights, and dead lights caused by sealant stress or external stimuli. To solve the defects of the sealant layer, three main solutions are generally adopted: scrapping, repairing and downgrading. Among them, repairing is an optimal solution to balance the quality and the yield. However, after an MLED display module is repaired with a sealant, there may be a color difference (difference in ink color) between a repaired module and a normal module.

Therefore, the repairing solutions for the MLED display module of the prior art need to be improved.

SUMMARY

A micro light-emitting display module is provided by embodiments of the present disclosure to solve a technical problem that a color difference between a repaired module and a normal module is serious, resulted by repairing a MLED display module of the prior art with a sealant.

To solve the above problem, technical solutions provided by the present disclosure are as follows.

A micro light-emitting display module is provided by embodiments of the present disclosure, the micro light-emitting display module includes a first display area and a second display area independent of each other, and the micro light-emitting display module includes a substrate, a plurality of micro light-emitting chips, an original sealant layer, and a repair sealant layer. The chips are disposed on the substrate in an array. The original sealant layer is disposed on and covering the micro light-emitting chips, the original sealant layer is located at least in the first display area and in the second display area. The repair sealant layer is disposed on the original sealant layer and located in the first display area, both of the original sealant layer and the repair sealant layer include optical particles, and a mass proportion of the optical particles in the repair sealant layer is different from a mass proportion of the optical particles in the original sealant layer, and/or, types of the optical particles in the repair sealant layer is different from types of the optical particles in the original sealing layer.

In some embodiments of the present disclosure, the optical particles include at least one of white optical particles and black optical particles, and a mass proportion of the white optical particles in the repair sealant layer is different from a mass proportion of the white optical particles in the original sealant layer, and/or a mass proportion of the black optical particles in the repair sealant layer is different from a mass proportion of the black optical particles in the original sealant layer.

In some embodiments of the present disclosure, the optical particles in the original sealant layer include the white optical particles and do not include the black optical particles, the optical particles in the repair sealant layer include the white optical particles of a same type as the white optical particles in the original sealant layer and do not include the black optical particles, and the mass proportion of the white optical particles in the repair sealant layer is lower than the mass proportion of the white optical particles in the original sealant layer.

In some embodiments of the present disclosure, the optical particles in the original sealant layer include the white optical particles and do not include the black optical particles, the optical particles in the repair sealant layer include the white optical particles and the black optical particles, and the mass proportion of the white optical particles in the repair sealant layer is lower than the mass proportion of the white optical particles in the original sealant layer.

In some embodiments of the present disclosure, the optical particles in the original sealant layer include the black optical particles and do not include the white optical particles, the optical particles in the repair sealant layer include the black optical particles of a same type as the black optical particles in the original sealant layer and do not include the white optical particles, and the mass proportion of the black optical particles in the repair sealant layer is lower than the mass proportion of the black optical particles in the original sealant layer.

In some embodiments of the present disclosure, the optical particles in the original sealant layer include the black optical particles and do not include the white optical particles, the optical particles in the repair sealant layer include the black optical particles and the white optical particles, and the mass proportion of the black optical particles in the repair sealant layer is higher than the mass proportion of the black optical particles in the original sealant layer.

In some embodiments of the present disclosure, the optical particles in the original sealant layer include the white optical particles and the black optical particles, the optical particles in the repair sealant layer include the white optical particles and do not include the black optical particles, and the mass proportion of the white optical particles in the repair sealant layer is lower than the mass proportion of the white optical particles in the original sealant layer.

In some embodiments of the present disclosure, the optical particles in the original sealant layer include the white optical particles and the black optical particles, the optical particles in the repair sealant layer include the black optical particles and do not include the white optical particles, and the mass proportion of the black optical particles in the repair sealant layer is lower than the mass proportion of the black optical particles in the original sealant layer.

In some embodiments of the present disclosure, both of the optical particles in the original sealant layer and the optical particles in the repair sealant layer include the white optical particles and the black optical particles, the mass proportion of the white optical particles in the original sealant layer is different from the mass proportion of the white optical particles in the repair sealant layer, and/or the mass proportion of the black optical particles in the original sealant layer is different from the mass proportion of the black optical particles in the repair sealant layer.

In some embodiments of the present disclosure, the micro light-emitting display module includes a plurality of display panels spliced with each other, each of the display panel is provided with a plurality of the micro light-emitting chips in an array, at least one of the display panels is located in the first display area, and the rest of the display panels are located in the second display area.

In some embodiments of the present disclosure, the mass proportion of the optical particles in the repair sealant layer ranges from 0.01% to 30%.

In some embodiments of the present disclosure, a thickness of the repair sealant layer is smaller than a thickness of the original sealant layer.

In some embodiments of the present disclosure, the white optical particles include at least one of a light-diffusing powder and a light-matting powder, and the black optical particles include black pigments.

Beneficial effects of the present disclosure: the micro light-emitting display module provided by the embodiments of the present disclosure includes the first display area and the second display area independent from each other, and the micro light-emitting display module includes the substrate, the light-emitting chips, the original sealant layer, and the repair sealant layer. The chips are disposed on the substrate in an array. The original sealant layer is disposed on and covering the micro light-emitting chips, the original sealant layer is located at least in the first display area and in the second display area. The repair sealant layer is disposed on the original sealant layer and located in the first display area, both of the original sealant layer and the repair sealant layer include the optical particles, and the mass proportion of the optical particles in the repair sealant layer is different from the mass proportion of the optical particles in the original sealant layer, and/or, the types of the optical particles in the repair sealant layer is different from the types of the optical particles in the original sealing layer. By optimizing the types and the mass proportion of the optical particles in the repair sealant layer, the color difference between the repaired first display area and the normal second display area could be made close, thereby ensuring that ink colors of each area are consistent.

DESCRIPTION OF DRAWINGS

To describe the technical solutions of the embodiments of the present disclosure or the prior art more clearly, the following briefly introduces the accompanying drawings used in the description of the embodiments of the present disclosure or the prior art. Apparently, the accompanying drawings described below illustrate only some embodiments of the present disclosure, and persons skilled in the art may derive other drawings from the drawings without making creative efforts.

DETAILED DESCRIPTION OF EMBODIMENTS

In description of the disclosure, it should be understood that orientational or positional relationships represented by directional terms mentioned in the present disclosure, such as thickness, up, down, etc., are orientational or positional relationships based on the drawings, and are merely for the convenience of describing the present disclosure and simplifying the description, rather than indicating or implying that the device or element is intended to have a particular orientation, or is constructed and operated in a particular orientation, and therefore, should not be interpreted as a limitation of the application. In addition, terms such as "first" and "second" are used herein for purposes of description, and should not be interpreted as indication or implication of relative importance, or implied indication of a number of the technical features. Therefore, features limited by terms such as "first" and "second" can explicitly or impliedly include one or more than one of these features.

In description of the disclosure, "a plurality of" means two or more than two, unless otherwise specified. In description of the disclosure, unless specified or limited otherwise, a structure in which a first feature is "on" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," a second feature may include an embodiment in which the first feature is right or obliquely "on," the second feature, or just means that the first feature is at a height higher than that of the second feature.

Figure 1:
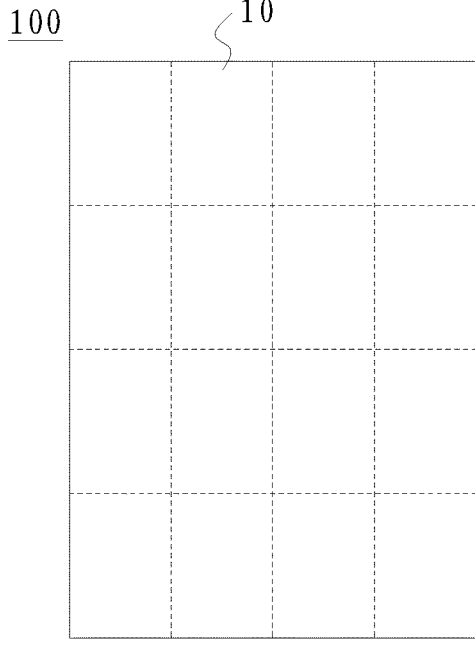
FIG. 1 is a schematic view of a micro light-emitting display module provided by an embodiment of the present disclosure.

Referring to FIG. 1, FIG. 1 is a schematic view of a micro light-emitting display module provided by an embodiment of the present disclosure. The micro light-emitting display module 100 provided by an embodiment of the present disclosure may be a mini light-emitting diode (Mini LED, a size of a light-emitting chip is between 50-200 microns) display module, or may be a micro light-emitting diode (Micro LED) display module.

The micro light-emitting display module 100 may be applied to large-screen high-definition display scenes. The micro light-emitting display module 100 includes a plurality of display panels 10 that are spliced with each other. During a manufacturing process of the display panel 10, light-emitting chips of the display panel 10 need to be encapsulated. For example, the light-emitting chips are encapsulated with a sealant layer, and the sealant layer needs to meet requirements of defect-free encapsulation. In the manufacturing process, it is inevitable to repair the sealant layer, when there are process defects such as pinholes, bubbles, foreign objects or lack of sealant during a sealing process, or defects left by repairing dead lights (the light-emitting chips does not emit light or emits abnormal light) after sealing.

Exemplarily, repairing solutions mainly includes a single-point sealant repair solution and a whole-surface sealant repair solution. In the single-point sealant repair solution, liquid sealant is filled at a defect position and is heat-cured after self-leveling. A disadvantage of the single-point sealant repair solution is that a volume of the defect position to be filled cannot be accurately measured and an amount of sealant to be filled cannot be filled accurately measured. At a same time, a sealant leveling is uncontrollable due to a surface tension of the liquid sealant. These combined factors may lead to an obvious difference in an appearance of the single-point glue location and a normal location. In addition, the single-point sealant repair solution is only suitable for defect repair with small areas and few repair points. In the whole-surface sealant repair solution, a defective module is placed in a module machine and sealant is added for hot pressing to form a whole-surface sealant layer on a surface of a defective module. A disadvantage of whole-surface sealant repair solution is that the whole-surface sealant will cause a color difference (a difference in ink color) between the defective module that has been repaired and a normal module that has not been repaired.

In view of the above problems, embodiments of the present disclosure may reduce the color difference between the repaired display panel and the normal display panel by optimizing types and doping mass proportion of optical particles in a repair sealant layer of the repaired display panel.

Figure 2:
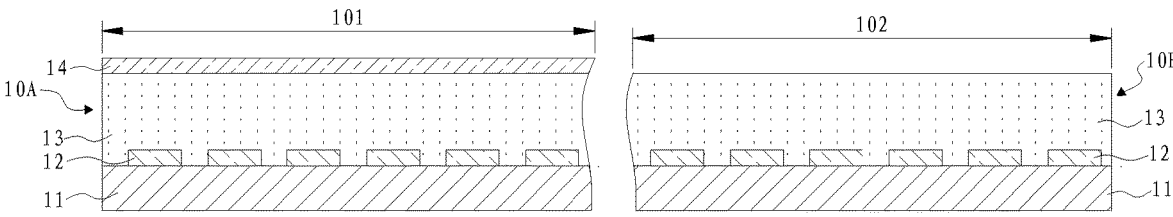
FIG. 2 is a schematic view of film layer stacking of a first display area and a second display area provided by an embodiment of the present disclosure.

Specifically, referring to FIG. 2, the micro light-emitting display module 100 includes a substrate 11, a plurality of micro light-emitting chips 12 disposed on the substrate 11, an original sealant layer 13 disposed on the micro light-emitting chips 12, and a repair sealant layer 14 disposed on the original sealant layer 13, the micro light-emitting chips 12 is distributed on the substrate 11 in an array, and the micro light-emitting chips 12 is covered by the original sealant layer 13.

The micro light-emitting chips 12 maybe mini light-emitting diode (mini LED) chips or micro light-emitting diode (micro led) chips. The substrate 11 includes a plurality of pixel driving circuits in an array, and each of the pixel driving circuits includes at least one thin film transistor. The pixel driving circuits drive the micro light-emitting chips to emit light, thereby realizing the micro light emitting display module 100 to be emitting.

In the embodiment of the present disclosure, the original sealant layer 13 is a sealant layer configured to encapsulate and protect the micro light-emitting chips 12 during the manufacturing process of the micro-light-emitting display module 100, and the repair sealant layer 14 is a sealant layer for repairing a part of the original sealant layer 13 when there are defects in the part of the original sealant layer 13 and need to be repaired.

Further, referring to FIG. 2, FIG. 2 is a schematic view of film layer stacking of a first display area and a second display area of the micro light emitting display module provided by the embodiment of the present disclosure. The micro light-emitting display module 100 includes the first display area and the second display area independent of each other, and "independent from each other" means adjacent to or spaced apart from each other. Exemplarily, the first display area 101 may be defined as an area that needs to be repaired with sealant, and the second display area 102 is a normal display area. It can be understood that the first display area 101 may be a whole continuous area, or may include a plurality of areas spaced from each other. When the micro light-emitting display module 100 is spliced by a plurality of display panels 10, the first display area 101 may correspond to one or more first display panels 10A, and the second display area 102 may correspond to one or more second display panels 10B. The first display panel 10A is a display panel whose original sealant layer 13 is defective and needs to be repaired, and the second display panel 10B is a normal display panel. When the micro light-emitting display module 100 is a whole display panel (without splicing), the first display area 101 may correspond to a display module of the whole display panel that needs to be repaired with sealant, and the second display area 102 may correspond to a normal display module of the whole display panel.

In some specific embodiments of the present disclosure, the micro light-emitting display module 100 is spliced by the plurality of display panels, the micro light-emitting display module 100 includes the first display panel 10A and the second display panel 10B, the first display panel 10A is located in the first display area 101, the second display panel 10B is located in the second display area 102, and the original sealing layer 13 is at least located in the first display area 101 and in the second display area 102. The repair sealant layer 14 is disposed on the original sealant layer 13, the repair sealant layer 14 is located in the first display area 102 and covers the micro light-emitting chips 12 in the first display area 102.

A main material of the repair sealant layer 14 and the original sealant layer 13 includes glue, and besides the glue, further includes some additives, such as optical particles. The optical particles include but are not limited to at least one of white optical particles and black optical particles. The white optical particles are used to improve a display effect, so that the outgoing light is more uniform and the viewing angle of light is larger. The black optical particles are used to improve the overall blackness of encapsulation product and improve the contrast, and more conducive to displaying images with a black background.

When selecting optical particles, choose materials with moderate particle size, easy dispersion and good compatibility with the glue. The white optical particles include but are not limited to at least one of a light-diffusing powder and a light-matting powder. The diffusing powder and the matting powder include but are not limited to inorganic titanium, silicon-based materials or polymer materials. The black optical particles include black pigments, and the black pigments include but are not limited to at least one of carbon-containing species such as carbon nanotubes, fullerenes, at least one of inorganic salts such as iron oxide, copper chromium oxide, iron chromium oxide, or organic black pigments such as nigrosine.

Exemplarily, the types and the mass proportion of the optical particles in the repair sealant layer 14 and the original sealant layer 13 are same, that is, when the original sealing layer 13 of the first display panel 10A is repaired with glue on an entire surface to form a repair sealant layer 14, the types and the mass proportion of the optical particles doped in the glue of the repair sealant layer 14 are not changed, the optical particles and the mass proportion thereof in the original sealing layer 13 is directly followed. However, in the whole-surface sealant repair solution, since the first display panel 10A has an extra layer of the repair sealant layer 14, there is a thickness difference between the repaired first display panel 10A and the normal second display panel 10B, and the thickness difference may lead to the color difference between the repaired first display panel 10A and the normal second display panel 10B under the support of optical particles such as the diffusing powder, the matting powder or the black pigment mixed in the glue.

But in some embodiments of the present disclosure, the mass proportion of the optical particles in the repair sealant layer 14 is different from the mass proportion of the optical particles in the original sealant layer 13, and/or, the types of the optical particles in the repair sealant layer 13 is different from the types of the optical particles in the original sealing layer 13. By adjusting the types, the mass proportion and a film thickness of the optical particles in the repair sealant layer 14, a color difference value between a repair area (the first display area 101) where the repair layer 14 is located and a normal area (the second display area 102) may be controlled, that is, the color difference between the first display panel 10A and the second display panel 10B may be controlled. As verified by the inventor through experiments, a chromatic aberration of the first display panel 10A repaired by the above solution may be controlled within 2.7, and a chromatic aberration value of the first display panel 10A repaired by the whole-surface repair solution without changing the mass proportion and the types of the optical particles is about 4, while a chromatic aberration value of the normal second display panel 10B is 0.5, 0.6 or 0.7. Therefore, the color difference between the repaired first display panel 10A and the normal second display panel 10B is closer by the repair solution of the embodiment of the present disclosure.

the mass proportion mentioned of the above embodiments of the present disclosure and mentioned below refer to a mass proportion of a certain material in the film layer where the material is located, for example, the mass proportion of the optical particles in the repair sealant layer 14 refers to a ratio of a mass of the optical particles in the repair sealant layer 14 to a total mass of the repair sealant layer 14, and a mass proportion of the black optical particles in the repair sealant layer 14 refers to a ratio of a mass of black optical particles to a total mass of the repair layer 14.

Specifically, the chromatic aberration may be adjusted with adjusting a mass ratio between white optical particles and black optical particles in the repair sealant layer 14. In other words, the mass proportion of the white optical particles in the repair sealant layer 14 is different from that of the white optical particles in the original sealant layer 13, and/or, the mass proportion of the black optical particles in the repair sealant layer 14 is different from that of the black optical particles in the original sealing layer 13.

In some embodiments, the optical particles in the original sealant layer 13 include the white optical particles and do not include the black optical particles. If the types and the mass proportion of the optical particles in the repair sealant layer are consistent with those in the original sealant layer 13, and the first display panel 10A is measured to be whiter, then the types and the mass proportion of the optical particles in the repair sealant layer 14 maybe adjusted. A same type of the white optical particles may be doped in the glue of the repair sealant layer 14, and the black optical particles are not doped, and the mass proportion of the doped white optical particles should be lower than that of the white optical particles in the original sealant layer 13. That is, the optical particles in the repair sealant layer 14 include the same type of the white optical particles as in the original sealant layer 13, and do not include the black optical particles, and the mass proportion of the white optical particles in the repair sealant layer 14 is lower than the mass proportion of the white optical particles in the original sealant layer 13.

The white optical particles and the black optical particles may also be doped in the glue of the repair sealant layer 14 at a same time, and the mass proportion of the white optical particles in the repair sealant layer 14 still needs to be lower than that of the white optical particles in the original sealant layer 13. By adjusting the doping mass proportion of the black optical particles in the repair sealant layer 14, the color difference between the first display panel 10A and the second display panel 10B may be as close as possible.

The black optical particles may also be doped in the glue of the repair sealant layer 14 instead of the white optical particles, and the mass proportion of the doped black optical particles should be lower than that of the white optical particles in the original sealant layer 13 quality ratio. That is, the optical particles in the repaired sealant layer 14 include the black optical particles and do not include the white optical particles, and the mass proportion of the black optical particles in the repair sealant layer 14 is lower than that of the white optical particles in the original sealant layer 13.

In some embodiments, the optical particles in the original sealant layer 13 include the black optical particles and do not include the white optical particles. If the types and the mass proportion of the optical particles in the repair sealant layer are consistent with those in the original sealant layer 13, the first display panel 10A is measured to be blacker, then a same type of the black optical particles may be doped in the glue of the repair sealant layer 14, and the mass proportion of the doped black optical particles should be lower than that of the black optical particles in the original sealant layer 13. That is, the optical particles in the repair sealant layer 14 include the same type of the black optical particles as in the original sealant layer 13, and do not include the white optical particles. The mass proportion of the black optical particles in the repair sealant layer 14 is lower than the mass proportion of the black optical particles in the original sealant layer 13.

The white optical particles and the black optical particles may also be doped in the glue of the repair sealant layer 14 at a same time, that is, the repair sealant layer 14 includes the white optical particles and the black optical particles. And the mass proportion of the black optical particles in the repair sealant layer 14 is higher than that of the black optical particles in the original sealant layer 13.

In some embodiments, the optical particles in the original sealant layer 13 includes the white optical particles and the black optical particles. If the types and the mass proportion of the optical particles in the repair sealant layer are consistent with those in the original sealant layer 13, the first display panel 10A is measured to be blacker, then the black optical particles may be doped in the glue of the repair sealant layer 14, and the mass proportion of the doped black optical particles should be lower than that of the black optical particles in the original sealant layer 13. That is, the optical particles in the repair sealant layer 14 include the black optical particles and do not include the white optical particles, and the mass proportion of the black optical particles in the repair sealant layer 14 is lower than the mass proportion of the black optical particles in the original sealant layer 13.

In some embodiments, the optical particles in the original sealant layer 13 include the white optical particles and the black optical particles. If the types and the mass proportion of the optical particles in the repair sealant layer are consistent with those in the original sealant layer 13, and the first display panel 10A is measured to be blacker, then the black optical particles may be doped in the glue of the repair sealant layer 14, and the white optical particles are not doped.

In some embodiments, the optical particles in the original sealant layer 13 include the white optical particles and the black optical particles. If the types and the mass proportion of the optical particles in the repair sealant layer are consistent with those in the original sealant layer 13, and the first display panel 10A is measured to be whiter, then the white optical particles may be doped in the glue of the repair sealant layer 14, and the mass proportion of the doped white optical particles should be lower than that of the white optical particles in the original sealant layer 13.

In some embodiments, the optical particles in the original sealant layer 13 include the white optical particles and the black optical particles. If the types and the mass proportion of the optical particles in the repair sealant layer are consistent with those in the original sealant layer 13, and the first display panel 10A is measured to be whiter, then the black optical particles may be doped in the glue of the repair sealant layer 14, and the white optical particles are not doped, and the mass proportion of the doped black optical particles should be lower than that of the black optical particles in the original sealant layer 13. That is, the optical particles in the repair sealant layer 14 include the black optical particles and do not include the white optical particles, and the mass proportion of the black optical particles in the repair sealant layer 14 should be lower than that of the black optical particles in the original sealant layer 13.

In some embodiments, the optical particles in the original sealant layer 13 include the white optical particles and the black optical particles, and the repair sealant layer 14 include the black optical particles and the white optical particles. The mass proportion of the white optical particles in the repair sealant layer 14 is different from the mass proportion of the white optical particles in the original sealant layer 13, and/or the mass proportion of the black optical particles in the repair sealant layer is different from the mass proportion of the black optical particles in the original sealant layer.

In some embodiments, the mass proportion of the optical particles in the repair sealant layer 13 is greater than zero and less than or equal to 30%. The mass proportion of the optical particles in the repair sealant layer 14 ranges from 0.01% to 30%. Values above or below the range, an appearance of the first display panel 10A may be inconsistent with an appearance of the second display panel 10B (specifically, a surface reflectance of the display panels is inconsistent, and there is the color difference).

In some embodiments, a thickness of the repair sealant layer 14 is smaller than a thickness of the original sealant layer 13. In one embodiment, the thickness of repair sealant layer 14 ranges from 10~100 microns. If the thickness is higher than the value range, display optical differences may appear between the first display panel 10A and the second display panel 10B, and a thickness of the products may be obviously inconsistent. If the thickness is lower than the value range, it may be difficult for the repair sealant layer 14 to ensure that the position of the defect is covered, and at a same time, it may increase difficulty of equipment processing.

In any of the above-mentioned embodiments, the adjustment of the mass proportion of the white optical particles and/or the black optical particles doped in the repair sealant layer 14 is based on ensuring that the color difference values the first display area 101 (the first display panel 10A provided with the repair sealant layer 14) and the second display area 102 (the second display panel 10B that normally does not need to be repaired) are as close as possible.

A repairing method of the micro light-emitting display module of the embodiments of the present disclosure includes: defining a first display panel 10A to be repaired and a normal second display panel 10B, measuring a color difference on the first display panel 10A to be repaired, configuring a glue mixture containing optical particles with a suitable concentration, placing the first display panel to be repaired in a module machine and adding the glue mixture for thermocompression molding to form a repair sealant layer on a surface of the first display panel 10A, measuring a color difference on the repaired first display panel 10A. A determination of the color difference value may be measured by a commercially available color difference meter.

Embodiment 1: The thickness of the original sealant layer 13 of the micro light-emitting display module is 230 microns, the optical particle of the original sealant layer 13 a light-diffusing powder with a mass proportion of 8%, and the color difference $\Delta E$ of each display panel is 0.65 before repairing. When repairing, the display panel with defects is sealed for a second time, and the thickness of the repair sealant layer 14 of the repaired display panel is 20 microns. The optical particle of the repair sealant layer 14 is a diffusion powder with a mass proportion of 3.5%, measured by the color difference meter, the color difference $\Delta E$ of the repaired display panel is 1.03, and the color difference $\Delta E$ of the normal display panel is 0.65.

Embodiment 2: The thickness of the original sealant layer 13 of the micro light-emitting display module is 230 microns, the optical particle of the original sealant layer 13 a light-diffusing powder with a mass proportion of 8%, and the color difference $\Delta E$ of each display panel is 0.65 before repairing. When repairing, the display panel with defects is sealed for a second time, and the thickness of the repair sealant layer 14 of the repaired display panel is 20 microns. The optical particles of the repair sealant layer 14 are a light-diffusing powder with a mass proportion of 5% and graphite with a mass proportion 0.15%, measured by the color difference meter, the color difference $\Delta E$ of the repaired display panel is 1.28, and the color difference $\Delta E$ of the normal display panel is 0.65.

Embodiment 3: The thickness of the original sealant layer 13 of the micro light-emitting display module is 230 microns, the optical particle of the original sealant layer 13 a light-diffusing powder with a mass proportion of 8%, and the color difference $\Delta E$ of each display panel is 0.65 before repairing. When repairing, the display panel with defects is sealed for a second time, and the thickness of the repair sealant layer 14 of the repaired display panel is 20 microns. The optical particle of the repair sealant layer 14 is graphite with a mass proportion 0.22%, measured by the color difference meter, the color difference $\Delta E$ of the repaired display panel is 1.56, and the color difference $\Delta E$ of the normal display panel is 0.65.

Comparative example 1: The thickness of the original sealant layer 13 of the micro light-emitting display module is 230 microns, the optical particle of the original sealant layer 13 a light-diffusing powder with a mass proportion of 8%, and the color difference $\Delta E$ of each display panel is 0.65 before repairing. When repairing, the display panel with defects is sealed for a second time, and the thickness of the repair sealant layer 14 of the repaired display panel is 20 microns. The optical particle of the repair sealant layer 14 is a light-diffusing powder with a mass proportion of 8%, measured by the color difference meter, the color difference $\Delta E$ of the repaired display panel is 3.11, and the color difference $\Delta E$ of the normal display panel is 0.65.

Embodiment 4: The thickness of the original sealant layer 13 of the micro light-emitting display module is 230 microns, the optical particle of the original sealant layer 13 graphite with a mass proportion of 0.9%, and the color difference $\Delta E$ of each display panel is 1.15 before repairing. When repairing, the display panel with defects is sealed for a second time, and the thickness of the repair sealant layer 14 of the repaired display panel is 20 microns. The optical particle of the repair sealant layer 14 is graphite with a mass proportion 0.81%, measured by the color difference meter, the color difference ΔE of the repaired display panel is 2.67, and the color difference ΔE of the normal display panel is 1.15.

Embodiment 5: The thickness of the original sealant layer 13 of the micro light-emitting display module is 230 microns, the optical particle of the original sealant layer 13 graphite with a mass proportion of 0.9%, and the color difference ΔE of each display panel is 1.15 before repairing. When repairing, the display panel with defects is sealed for a second time, and the thickness of the repair sealant layer 14 of the repaired display panel is 20 microns. The optical particles of the repair sealant layer 14 are a light-diffusing powder with a mass proportion of 3% and graphite with a mass proportion 1.05%, measured by the color difference meter, the color difference ΔE of the repaired display panel is 2.31, and the color difference ΔE of the normal display panel is 1.15.

Comparative example 2: The thickness of the original sealant layer 13 of the micro light-emitting display module is 230 microns, the optical particle of the original sealant layer 13 graphite with a mass proportion of 0.9%, and the color difference ΔE of each display panel is 1.15 before repairing. When repairing, the display panel with defects is sealed for a second time, and the thickness of the repair sealant layer 14 of the repaired display panel is 20 microns. The optical particle of the repair sealant layer 14 is graphite with a mass proportion 0.9%, measured by the color difference meter, the color difference ΔE of the repaired display panel is 4.2, and the color difference ΔE of the normal display panel is 1.15.

Embodiment 6: The thickness of the original sealant layer 13 of the micro light-emitting display module is 230 microns, the optical particles of the original sealant layer 13 are a light-diffusing powder with a mass proportion of 3% and graphite with a mass proportion 1.05%, and the color difference ΔE of each display panel is 1.04 before repairing. When repairing, the display panel with defects is sealed for a second time, and the thickness of the repair sealant layer 14 of the repaired display panel is 20 microns. The optical particle of the repair sealant layer 14 is graphite with a mass proportion 0.9%, measured by the color difference meter, the color difference ΔE of the repaired display panel is 2.51, and the color difference E of the normal display panel is 1.04.

Embodiment 7: The thickness of the original sealant layer 13 of the micro light-emitting display module is 230 microns, the optical particles of the original sealant layer 13 are a light-diffusing powder with a mass proportion of 3% and graphite with a mass proportion 1.05%, and the color difference ΔE of each display panel is 1.04 before repairing. When repairing, the display panel with defects is sealed for a second time, and the thickness of the repair sealant layer 14 of the repaired display panel is 20 microns. The optical particles of the repair sealant layer 14 are a light-diffusing powder with a mass proportion of 2.1% and graphite with a mass proportion 0.95%, measured by the color difference meter, the color difference ΔE of the repaired display panel is 2.35, and the color difference ΔE of the normal display panel is 1.04.

Embodiment 8: The thickness of the original sealant layer 13 of the micro light-emitting display module is 230 microns, the optical particles of the original sealant layer 13 are a light-diffusing powder with a mass proportion of 3% and graphite with a mass proportion 1.05%, and the color difference ΔE of each display panel is 1.04 before repairing. When repairing, the display panel with defects is sealed for a second time, and the thickness of the repair sealant layer 14 of the repaired display panel is 20 microns. The optical particle of the repair sealant layer 14 is a light-diffusing powder with a mass proportion of 1.05%, measured by the color difference meter, the color difference ΔE of the repaired display panel is 1.98, and the color difference ΔE of the normal display panel is 1.04.

Comparative example 3: The thickness of the original sealant layer 13 of the micro light-emitting display module is 230 microns, the optical particles of the original sealant layer 13 are a light-diffusing powder with a mass proportion of 3% and graphite with a mass proportion 1.05%, and the color difference ΔE of each display panel is 1.04 before repairing. When repairing, the display panel with defects is sealed for a second time, and the thickness of the repair sealant layer 14 of the repaired display panel is 20 microns. The optical particles of the repair sealant layer 14 are a light-diffusing powder with a mass proportion of 3% and graphite with a mass proportion 1.05%, measured by the color difference meter, the color difference ΔE of the repaired display panel is 3.88, and the color difference ΔE of the normal display panel is 1.04.

By comparing the above embodiments and the comparative examples, the embodiments of the present disclosure may make the color difference between the repaired display panel and the normal display panel close to each other by adjusting the types/mass proportion of the optical particles in the repair sealant layer 14, so as to ensure that the ink colors of the two are consistent.

In summary, the micro light-emitting display module provided by the embodiments of the present disclosure includes the first display area and the second display outside the first display area, and the micro light-emitting display module includes the substrate, the light-emitting chips, the original sealant layer, and the repair sealant layer. The chips are disposed on the substrate in an array. The original sealant layer is disposed on and covering the micro light-emitting chips, the original sealant layer is located at least in the first display area and in the second display area. The repair sealant layer is disposed on the original sealant layer and located in the first display area, both of the original sealant layer and the repair sealant layer include the optical particles, and the mass proportion of the optical particles in the repair sealant layer is different from the mass proportion of the optical particles in the original sealant layer, and/or, the types of the optical particles in the repair sealant layer is different from the types of the optical particles in the original sealing layer. By optimizing the types and the mass proportion of the optical particles in the repair sealant layer, the color difference between the repaired first display area and the normal second display area could be made close, thereby ensuring that ink colors of each area are consistent.

In the foregoing embodiments, the description of each of the embodiments has respective focuses. For a part that is not described in detail in an embodiment, reference may be made to relevant descriptions in other embodiments.

The micro light-emitting display module provided in the embodiments of the present disclosure are described in detail above. The principle and implementations of the present disclosure are described in this specification by using specific examples. The description about the foregoing embodiments is merely provided to help understand the method and core ideas of the present disclosure. It should be noted that the foregoing embodiments are merely intended for describing the technical solutions of the present disclosure but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present disclosure.

What is claimed is:

1. A micro light-emitting display module, comprising a first display area and a second display area independent of each other, and the micro light-emitting display module comprising:

a substrate;

a plurality of micro light-emitting chips disposed on the substrate in an array;

an original sealant layer disposed on the micro light-emitting chips and covering the micro light-emitting chips, wherein the original sealant layer is located at least in the first display area and in the second display area; and a repair sealant layer disposed on the original sealant layer and located only in the first display area;

wherein both of the original sealant layer and the repair sealant layer comprise optical particles, and a mass proportion of the optical particles in the repair sealant layer is different from a mass proportion of the optical particles in the original sealant layer.

2. The micro light-emitting display module of claim 1, wherein the optical particles comprise at least one of white optical particles and black optical particles, and a mass proportion of the white optical particles in the repair sealant layer is different from a mass proportion of the white optical particles in the original sealant layer, and/or a mass proportion of the black optical particles in the repair sealant layer is different from a mass proportion of the black optical particles in the original sealant layer.

3. The micro light-emitting display module of claim 2, wherein the optical particles in the original sealant layer comprise the white optical particles and do not comprise the black optical particles, the optical particles in the repair sealant layer comprise the white optical particles of a same type as the white optical particles in the original sealant layer and do not comprise the black optical particles, and the mass proportion of the white optical particles in the repair sealant layer is lower than the mass proportion of the white optical particles in the original sealant layer.

4. The micro light-emitting display module of claim 2, wherein the optical particles in the original sealant layer comprise the white optical particles and do not comprise the black optical particles, the optical particles in the repair sealant layer comprise the white optical particles and the black optical particles, and the mass proportion of the white optical particles in the repair sealant layer is lower than the mass proportion of the white optical particles in the original sealant layer.

5. The micro light-emitting display module of claim 2, wherein the optical particles in the original sealant layer comprise the white optical particles and do not comprise the black optical particles, the optical particles in the repair sealant layer comprise the black optical particles and do not comprise the white optical particles, and the mass proportion of the black optical particles in the repair sealant layer is lower than the mass proportion of the white optical particles in the original sealant layer.

6. The micro light-emitting display module of claim 2, wherein the optical particles in the original sealant layer comprise the black optical particles and do not comprise the white optical particles, the optical particles in the repair sealant layer comprise the black optical particles of a same type as the black optical particles in the original sealant layer and do not comprise the white optical particles, and the mass proportion of the black optical particles in the repair sealant layer is lower than the mass proportion of the black optical particles in the original sealant layer.

7. The micro light-emitting display module of claim 2, wherein the optical particles in the original sealant layer comprise the black optical particles and do not comprise the white optical particles, the optical particles in the repair sealant layer comprise the black optical particles and the white optical particles, and the mass proportion of the black optical particles in the repair sealant layer is higher than the mass proportion of the black optical particles in the original sealant layer.

8. The micro light-emitting display module of claim 2, wherein the optical particles in the original sealant layer comprise the white optical particles and the black optical particles, the optical particles in the repair sealant layer comprise the white optical particles and do not comprise the black optical particles, and the mass proportion of the white optical particles in the repair sealant layer is lower than the mass proportion of the white optical particles in the original sealant layer.

9. The micro light-emitting display module of claim 2, wherein the optical particles in the original sealant layer comprise the white optical particles and the black optical particles, the optical particles in the repair sealant layer comprise the black optical particles and do not comprise the white optical particles, and the mass proportion of the black optical particles in the repair sealant layer is lower than the mass proportion of the black optical particles in the original sealant layer.

10. The micro light-emitting display module of claim 2, wherein both of the optical particles in the original sealant layer and the optical particles in the repair sealant layer comprise the white optical particles and the black optical particles, wherein the mass proportion of the white optical particles in the original sealant layer is different from the mass proportion of the white optical particles in the repair sealant layer, and/or the mass proportion of the black optical particles in the original sealant layer is different from the mass proportion of the black optical particles in the repair sealant layer.

11. The micro light-emitting display module of claim 2, wherein the mass proportion of the optical particles in the repair sealant layer ranges from 0.01% to 30%.

12. The micro light-emitting display module of claim 2, wherein a thickness of the repair sealant layer is smaller than a thickness of the original sealant layer.

13. The micro light-emitting display module of claim 2, wherein the white optical particles comprise at least one of a light-diffusing powder and a light-matting powder.

14. The micro light-emitting display module of claim 13, wherein the light-diffusing powder and the light-matting powder comprise at least one of inorganic titanium, silicon-based materials and polymer materials.

15. The micro light-emitting display module of claim 2, wherein the black optical particles comprise black pigments.

16. The micro light-emitting display module of claim 15, wherein the black pigments comprise at least one of carbon nanotubes, fullerene, graphite, iron oxide, copper chromium oxide, iron chromium oxide and nigrosine.

17. The micro light-emitting display module of claim 1, wherein the micro light-emitting display module comprises a plurality of display panels spliced with each other, at least one of the display panels is located in the first display area, and the rest of the display panels are located in the second display area.

18. The micro light-emitting display module of claim 17, wherein each of the display panels is provided with a plurality of the micro light-emitting chips in an array, and the plurality of the micro light-emitting chips are covered by the original sealant layer.

19. The micro light-emitting display module of claim 18, wherein the micro light-emitting chips are mini light-emitting diode (mini led) chips or micro light-emitting diode (micro led) chips.

20. The micro light-emitting display module of claim 18, wherein the substrate comprises a plurality of pixel driving circuits in an array, and the pixel driving circuits drive the micro light-emitting chips to emit light.

\* \* \* \* \*